(12) United States Patent
Singh

(10) Patent No.: US 6,213,378 B1
(45) Date of Patent: *Apr. 10, 2001

(54) METHOD AND APPARATUS FOR ULTRA-FINE PITCH WIRE BONDING

(75) Inventor: Inderjit Singh, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/250,693

(22) Filed: Feb. 16, 1999

Related U.S. Application Data

(63) Continuation-in-part of application No. 08/890,354, filed on Jul. 9, 1997, now Pat. No. 5,938,105, which is a continuation-in-part of application No. 08/784,271, filed on Jan. 15, 1997, now Pat. No. 6,065,667.

(51) Int. Cl.[7] ............... B23K 1/06; B23K 5/20; B23K 20/10; B23K 31/00; B23K 31/02
(52) U.S. Cl. .................... 228/110.1; 228/180.5
(58) Field of Search .................... 228/180.5, 110.1

(56) References Cited

U.S. PATENT DOCUMENTS

| | | | |
|---|---|---|---|
| 3,643,321 | * | 2/1972 | Field et al. .................... 29/470.1 |
| 3,672,047 | * | 6/1972 | Sakamoto et al. ............. 29/628 |
| 4,415,115 | * | 11/1983 | James ............................ 228/170 |
| 4,765,526 | * | 8/1988 | Sato ............................... 228/4.5 |
| 4,955,523 | * | 9/1990 | Calomagno et al. .......... 228/179 |
| 5,037,023 | * | 8/1991 | Akiyama et al. .............. 228/102 |
| 5,111,989 | * | 5/1992 | Holdgrafer et al. .......... 228/110 |
| 5,115,960 | * | 5/1992 | Shimizu ......................... 228/110 |
| 5,244,140 | * | 9/1993 | Ramsey et al. ................ 228/110.1 |
| 5,395,037 | * | 3/1995 | Takahashi et al. ............ 228/180.5 |
| 5,421,503 | * | 6/1995 | Perlberg et al. ............... 228/4.5 |
| 5,431,329 | * | 7/1995 | Hasegawa et al. ............ 228/180.5 |
| 5,465,899 | * | 11/1995 | Quick et al. ................... 228/180.5 |
| 5,586,713 | * | 12/1996 | Field et al. .................... 29/470.1 |
| 5,938,105 | * | 8/1999 | Singh ............................. 228/180.5 |

FOREIGN PATENT DOCUMENTS

| | | |
|---|---|---|
| 55-096643A | 7/1980 | (JP) . |
| 59-191338A | 10/1984 | (JP) . |
| 61-005536A | 1/1986 | (JP) . |
| 3-027544A | 2/1991 | (JP) . |

* cited by examiner

*Primary Examiner*—Gregory Mills
*Assistant Examiner*—Zidia T. Pittman
(74) *Attorney, Agent, or Firm*—Beyer Weaver & Thomas, LLP

(57) ABSTRACT

An improved wire bonding capillary construction as well as a variety of improved wire bonding techniques are described. In one method aspect of the invention, the bonding parameters are controlled to prevent the creation of flash. In other aspects bonding parameters are controlled to provide high quality bonds even at relatively low bonding temperatures. By way of example, good bonding may be obtained even at room temperature and/or without preheating the bonding surface whatsoever. Other bonding parameters including bonding force, bond power and duration may also be controlled in a manner that provides good intermetallic formation between the bonding wire and the bonding surface with or without the creation of flash.

21 Claims, 13 Drawing Sheets

METHOD AND APPARATUS FOR ULTRA-FINE PITCH WIRE BONDING

RELATED APPLICATIONS

This application is a continuation-in-part of application Ser. No. 08/890,354 now U.S. Pat. No. 5,938,105 filed Jul. 9th, 1997, which in turn is a continuation in part of application Ser. No. 08/784,271 now U.S. Pat. No. 6,065,667 filed Jan. 15th, 1997, both of which are incorporated herein by reference.

FIELD OF THE INVENTION

The present invention pertains to wire bonding used in packaging semiconductor devices and the like. More particularly, the present invention relates to improved capillary designs and ball bonding techniques utilizing such capillaries.

BACKGROUND OF THE INVENTION

There has been a continuing trend in the semiconductor industry toward smaller semiconductor devices with higher transistor density and an increasing number of input/output connections. This trend has led to semiconductor devices having an increased density of chip input/output connections and shrinking bond pad sizes. Semiconductor devices having small bond pad center to center distances are called fine pitch semiconductor devices. Wire bonding technology is currently being challenged by requirements of semiconductor devices having bonding pad center to center distances of less than 100 micrometers.

In semiconductor fabrication, wire bonding remains the dominant chip interconnection technology for fine pitch semiconductor devices. Gold or aluminum wire is commonly used to connect a bonding pad of a semiconductor die to a lead of the semiconductor device. Typically, ball bonding is used to connect the wire to the bond pad while wedge bonding, also called stitch bonding, is used to connect the wire to the lead. Commonly, a wire bonding apparatus including a capillary is used for both the ball bonding and the wedge bonding.

FIG. 1A shows a vertical cross section of a prior art capillary 111. The capillary 111 has a longitudinally extending wire feed bore 102 formed therethrough. The bore 102 typically includes a chamfer 105 that splays slightly outward towards the distal tip of the capillary 111 to an outer chamfer diameter 106. In operation, wire is fed downward through the wire feed bore 102, and out a bottom aperture 104 of the capillary 111.

FIG. 1B shows a vertical cross section of a prior art capillary 100 having a double chamfer structure. The capillary 100 has a first chamfer diameter 107 and a second chamfer diameter 109.

FIG. 1C shows a vertical cross section of the capillary 100 horizontally restraining a wire 110 while an electronic flame off mechanism (EFO) 112 applies energy to a distal end of the wire 110. The application of energy by the EFO 112 creates a free air ball 114 at the distal end of the wire 110. The wire 110 is held by a clamp (not shown) during this free air ball formation process. Size parameters of the free air ball 114 include a free air ball diameter 115. For a wire bonding apparatus using the capillary 100, the size of the free air ball 114 can be controlled by varying hardware and software parameters of the wire bonding apparatus. After formation of the free air ball 114, the clamp releases the wire 110 and the capillary 100 is used to bond the distal end of the wire 110 to a bond pad surface as explained below.

FIG. 1D shows a vertical cross section of the capillary 100 being used to form a ball bond 115 between the distal end of the wire 110 and a surface of a bond pad 116. The bond pad 116 is located on a semiconductor die which has a center to center bond pad distance (also called the bond pad pitch of the semiconductor device). After the formation of the free air ball 114, as explained above, the free air ball 114 (FIG. 1B) is forced downward to the bond pad 116 by the capillary 100. The capillary 100 is used in conjunction with thermal and ultrasonic energy to create the ball bond 115 between the distal end of the wire 110 and the bond pad 116. An anchoring area 103 represents the surface of the capillary 100 in contact with the ball bond 115. Size parameters associated with the ball bond 115 include a ball bond height 120, a standoff distance 123 and a footprint 122.

As the center to center bond pad distance (or bond pad pitch) is decreased in a semiconductor device, the size of the bond pad 116 is typically decreased. For example, a semiconductor device having a 70 micron bond pad pitch can have a 60 micron×60 micron bond pad 116. It is very difficult to consistently achieve a ball bond 115 small enough to fit on a bond pad 116 of this size using the capillary 100. The footprint 122 must be limited in order to prevent flash of wire metal over to an adjacent bond pad 116 thereby creating a short between adjacent bond pads 116. A short between adjacent bond pads 116 can result in operational failure of the semiconductor device.

With reference still to FIG. 1C, one problem with use of the capillary 100 is that it is difficult to precisely control the size of the ball bond 115. For a wire bonding apparatus using the capillary 100, the size of the ball bond 115 (including the ball bond height 120 and footprint 122) is dependent on the size of the free air ball 114 (FIG. 1B). Hardware and software parameters of the bonding apparatus must be adjusted to vary the size of the free air ball 114 (FIG. 1B). For a wire bonding apparatus using the capillary 100, the size of the ball bond 115 is also dependent on parameters such as the bonding power, capillary tip position, bonding force, component temperatures and the nature of the ultrasonic energy delivered during the formation of the ball bond 115. For ball bonding of fine pitch semiconductor devices, the tip dimension 108 of the capillary 100 can be reduced so that the capillary 100 can form a ball bond 115 small enough to fit on the small bond pad 116. However, reducing the outer diameter tip dimension 108 weakens the capillary 100 which is subjected to great stress particularly during wedge bonding as explained below. The most significant factors that decide the shape and strength of the ball bond 115 are the tip dimension 108 and second chamfer diameter 109 of the capillary 100.

Conventional ball bonding techniques require a combination of ultrasonic energy provided by an ultrasonic transducer coupled to the capillary 100 and thermal energy stored in the bond pad. Typically, the bond pad and semiconductor die must be pre-heated to at least 150 degrees Celsius which may have detrimental effects on the semiconductor die. As an example, for silicon used in most conventional wafer technology surfaces, preheating the bonding surface prior to ball bonding may result in degradation of dopant regions of the silicon substrate. Current ball bonding techniques also require ultrasonic energy input at no less than 60 mW. Ultrasonic bond power is kept to a minimum for a number of reasons including shorter tool longevity and reduced capillary tip position control associated with higher bond power levels. Bond force is also kept to a minimum for the same reasons as bond power. Lower force also results in less gold contamination at capillary face dimensions that ensure reliable wedge bonding.

FIG. 1E shows a vertical cross section of a wedge bond 124 formed by the capillary 100. The wedge bond 124 is formed between an extended length of the wire 110 and a surface of an inner lead 126 of a lead frame. Reducing the tip dimension 108 of the capillary 100, to reduce the size of the ball bond 115 as described above, causes degradation in strength of the wedge bond 124. This is due to the fact that the area in which the wedge bond 124 is formed depends on the outer diameter tip dimension 108 of the capillary 100. Therefore, a difficult problem with using the capillary 100 concerns the tradeoff between a small outer diameter tip dimension 108 for achieving small ball bonds and a larger outer diameter tip dimension 108 for achieving strong wedge bonds. In view of the foregoing, it should be apparent that improved wire bonding techniques would be desirable.

SUMMARY OF THE INVENTION

An improved capillary construction as well as a variety of improved wire bonding techniques are described. In one method aspect of the invention, a free air ball is formed that is at least partially contained within an opening in the distal tip of the capillary. The capillary tip is positioned over a bonding surface and the bonding wire is ultrasonically welded to the bonding surface using bonding parameters that prevent the creation of flash. As such, in many situations, the resulting ball bond has a footprint diameter that is less than the diameter of the cavity.

In another aspect of the invention, methods are described that permit ball bonding to be done at relatively low bonding temperatures. By way of example, good bonding may be obtained even at bonding temperatures of less than approximately 100 degrees centigrade. Indeed, quality bonding may be done at room temperature and/or without preheating the bonding surface whatsoever.

In another aspect, the downward capillary force is controlled during bonding such that the size of the ball bond footprint is less than the tip diameter of the cavity. In this embodiment bonding is done using bonding forces that are significantly lower than the bonding forces commonly used today. By way of example, the ultrasonic bonding may readily be done using bonding forces of less than approximately 250 mN. For example, bonding forces of less than approximately 100 mN work well in many applications.

In another aspect, if desired, the footprint of ball bonds may be precisely controlled. By way of example, footprint tolerances having a standard deviation of the footprint is less than approximately 1 micron.

In still other embodiments, the bonding parameters are controlled to provide high quality bonds that include flash.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances well known processes, procedures, components, and circuits have not been described in detail so as not to unnecessarily obscure aspects of the present invention.

Figure 1A:
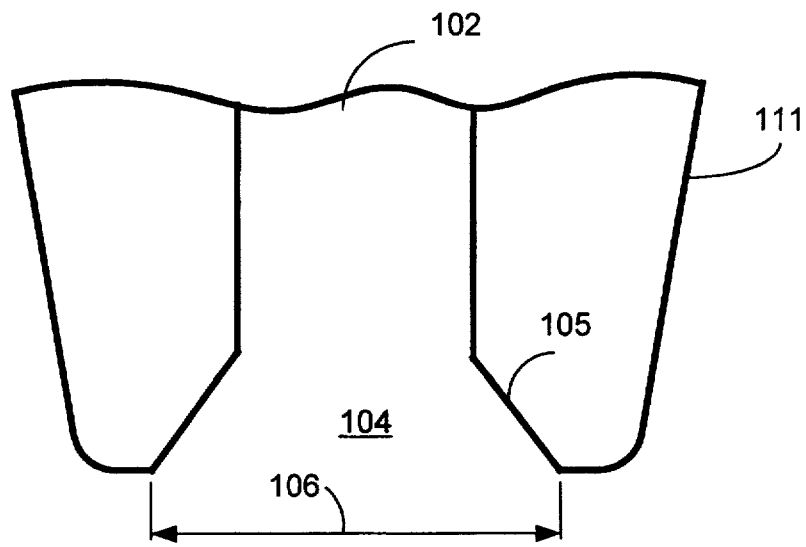
FIG. 1A is a diagrammatic vertical cross section of a prior art capillary suitable for wire bonding in semiconductor devices.
Figure 1B:
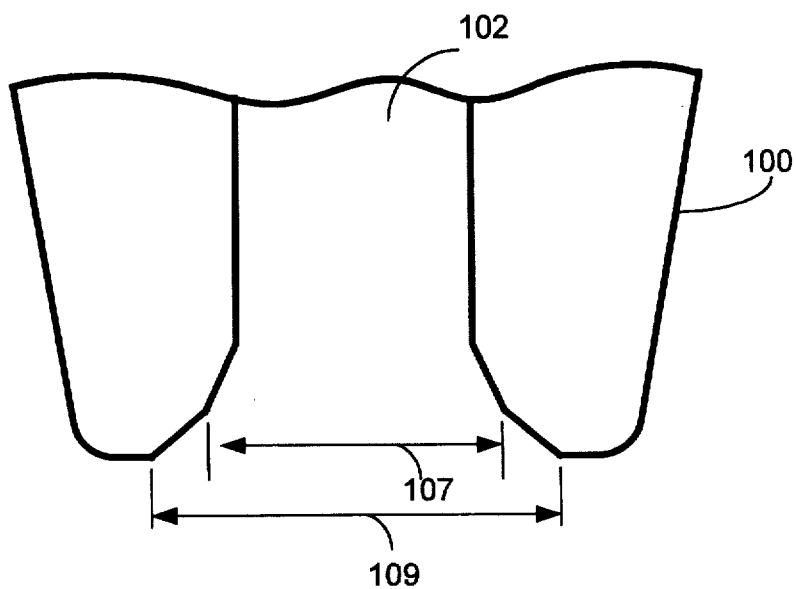
FIG. 1B shows a vertical cross section of a prior art capillary having a double chamfer structure.
Figure 1C:
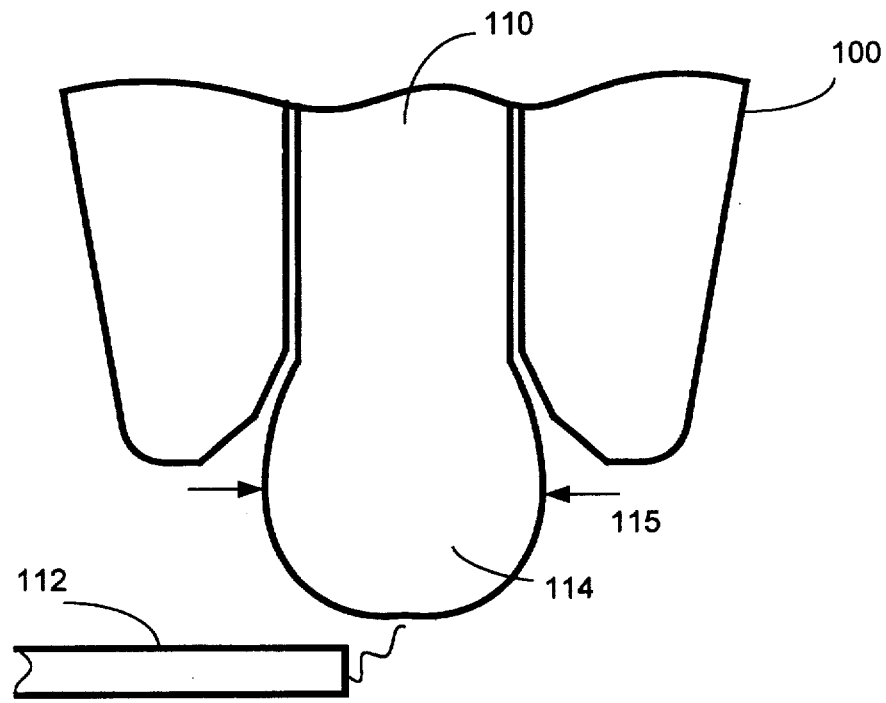
FIG. 1C shows a vertical cross section of the capillary horizontally restraining a wire while an electronic flame off mechanism (EFO) applies energy to a distal end of the wire.
Figure 1D:
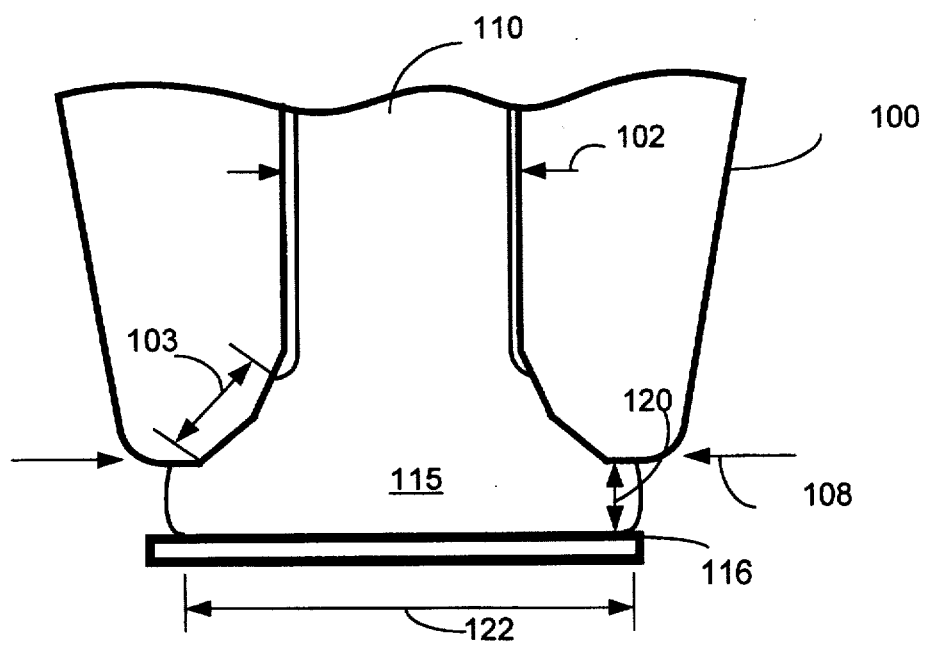
FIG. 1D shows a vertical cross section of the capillary being used to form a ball bond between the distal end of the wire and a surface of a bond pad.
Figure 1E:
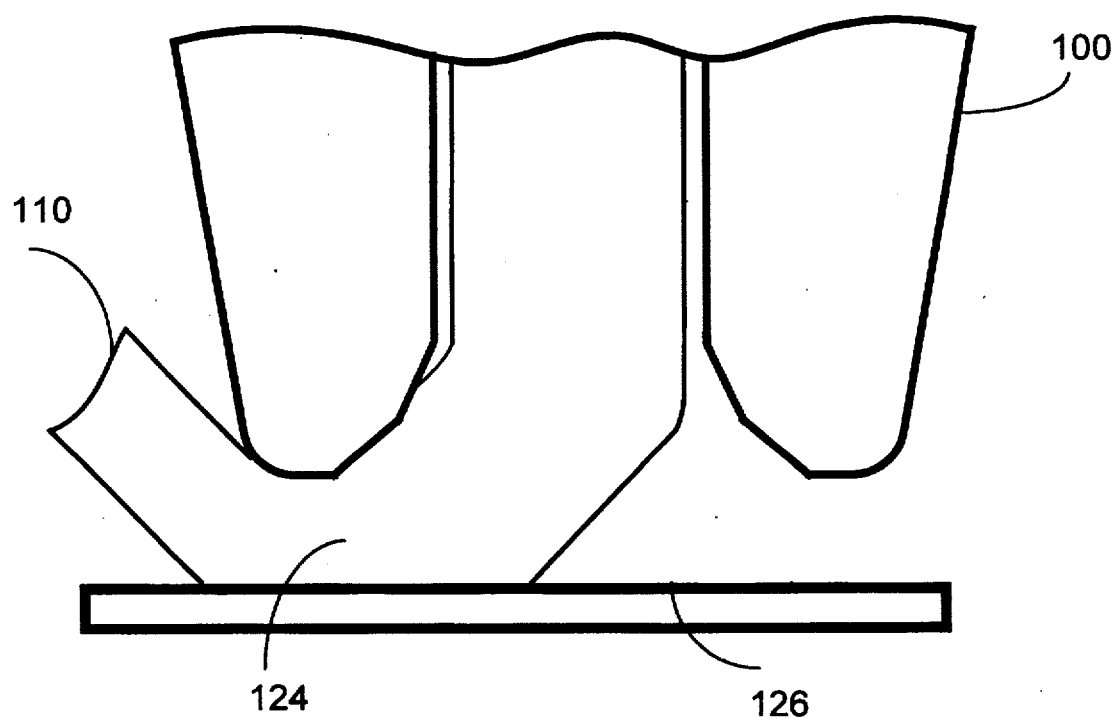
FIG. 1E is a diagrammatic vertical cross section of the prior art capillary illustrated in FIG. 1A illustrating a wedge bond created by the bonding apparatus.
Figure 2:
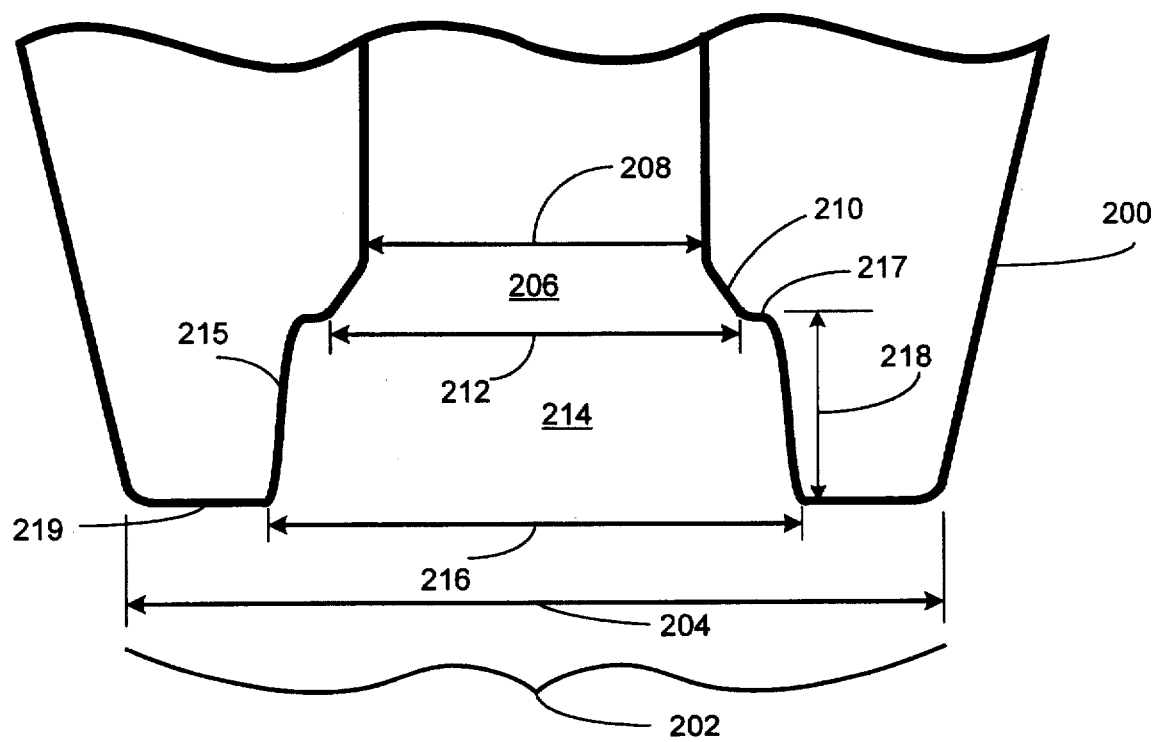
FIG. 2 is a diagrammatic vertical cross section of a capillary formed in accordance with one embodiment of the present invention.

Referring initially to FIG. 2, a diagrammatic vertical cross section of a capillary 200 suitable for use with the present invention is shown. The capillary 200 can be used for both ball bonding and wedge bonding. In an embodiment of the present invention, the capillary 200 may have a substantially standard exterior form which slightly tapers from a top end (not shown) of the capillary 200 to a bottom end of the capillary 200. The bottom end of the capillary 200 forms a capillary tip 202. The capillary tip 202 has an outer diameter tip dimension 204. The outer diameter tip dimension 204 can be varied depending on the needs of a particular application. By way of example, an outer diameter tip dimension 204 of about 64 microns (2.5 mils) has been found to work well for use in wire bonding of a semiconductor device having a 50 micron center to center bond pad distance.

A wire feed bore 206, having a minimum bore diameter 208, extends from the top end of the capillary 200 towards the capillary tip 202. As is well know in the art, the minimum bore diameter 208 can be varied depending on the diameter of wire required for a bonding application. Bore diameters ranging from 2 to 5 microns greater than the wire diameter have been found to work well. For example, a minimum bore diameter 208 of about 30 microns (1.2 mils) works well for wire bonding applications requiring a wire diameter of about 25.4 microns (1 mil).

The wire feed bore 206 includes a chamfer 210 that opens into a cavity 214. The chamfer 210 has smooth walls that splay outward towards its opening into the cavity 214. The chamfer angle may be varied depending on the needs of a particular application. By way of example, chamfer face angles (with respect to the vertical axis) between about 30 degrees and about 60 degrees have been found to work well. The corners of the chamfer 210 are typically rounded to prevent the presentation of sharp edges. In alternative embodiments, the chamfer 210 may be somewhat curved or the chamfer walls may be roughened. The chamfer 210 has a maximum chamfer diameter 212. The maximum chamfer diameter 212 can be varied depending on the needs of a particular wire bonding application. For wire bonding applications utilizing a wire having a diameter of about 25.4 microns, and a capillary having a wire feed bore diameter of about 30 microns, maximum chamfer diameters 212 in the range of about 32 microns to about 38 microns has been found to work well.

A walled cavity 214 in the capillary tip 202 is adjacent to and continuous with the chamfer 210 and the wire feed bore 206. The cavity 214 defines cavity walls 215 and may include a recessed tip surface 217. The actual geometry of the cavity may be varied somewhat. By way of example, the cavity walls 215 may be domed, substantially frusto-conical or even substantially cylindrical (although some taper is generally preferred). By way of example, tapers in the range of approximately zero to 10 degrees, as for example, in the range of about 5–10 degrees works well in a frusto-conical implementation. The cavity walls 215 preferably have a matte (roughened) surface to help hold the molten ball bond in place, although smooth walls may be used as well. It is noted that the use of a matte surface for the cavity walls 215 improves the shear strength of the resulting ball bonds. The recessed tip surface 217 may be tapered relative to a horizontal axis.

The cavity footprint diameter 216 can be varied depending on the needs of a particular wire bonding application. For example, cavity footprint diameters 216 in the range of about 38 microns to about 46 microns have been found to work well for use in wire bonding of semiconductor devices having center to center bond pad distances of about 60 microns. Cavity footprint diameters of about 33–38 microns work well for use in wire bonding of devices having center to center bond pad distance of about 50 microns. Of course bigger capillaries can have correspondingly larger cavity diameters as well.

The cavity 214 has a cavity height 218. The cavity height 218 can also be varied depending on the needs of a particular wire bonding application. By way of example, cavity heights in the range of approximately 10 to 15 microns work well. For example, a cavity height 218 of about 10 microns has been found to work well for use in wire bonding of semiconductor devices having center to center bond pad distances of about 50 microns. In an embodiment of the present invention, all edges of the cavity 214 are rounded. The portion of the capillary tip 202 outside of the cavity 214 defines a wedge surface 219.

With reference still to FIG. 2, the capillary 200 can be used for both ball bonding and wedge bonding. In operation, wire is fed through the wire feed bore 206. For ball bonding, an electronic flame off (EFO) mechanism is used to create a free air ball at a distal end of the wire. The free air ball is then ultrasonically welded to a suitable bonding surface (as for example, a bond pad on a semiconductor device) in order to create a ball bond. The capillary 200 provides strong precision ball bonds as explained below. The capillary 200 is well suited for use in ball bonding on semiconductor devices having very small center to center bond pad distances (fine bond pad pitch) and very small bond pad surface areas. As described in more detail below, ball bonding can be done at a wide variety of temperatures and experiments have shown good ball bonding results even at room temperature. Further, the capillary 200 is also well suited for use in wedge bonding of semiconductor devices having very small center to center lead, trace or contact distances (e.g. fine pitch lead frames). These and other advantages of the present invention are explained below.

Figure 3:
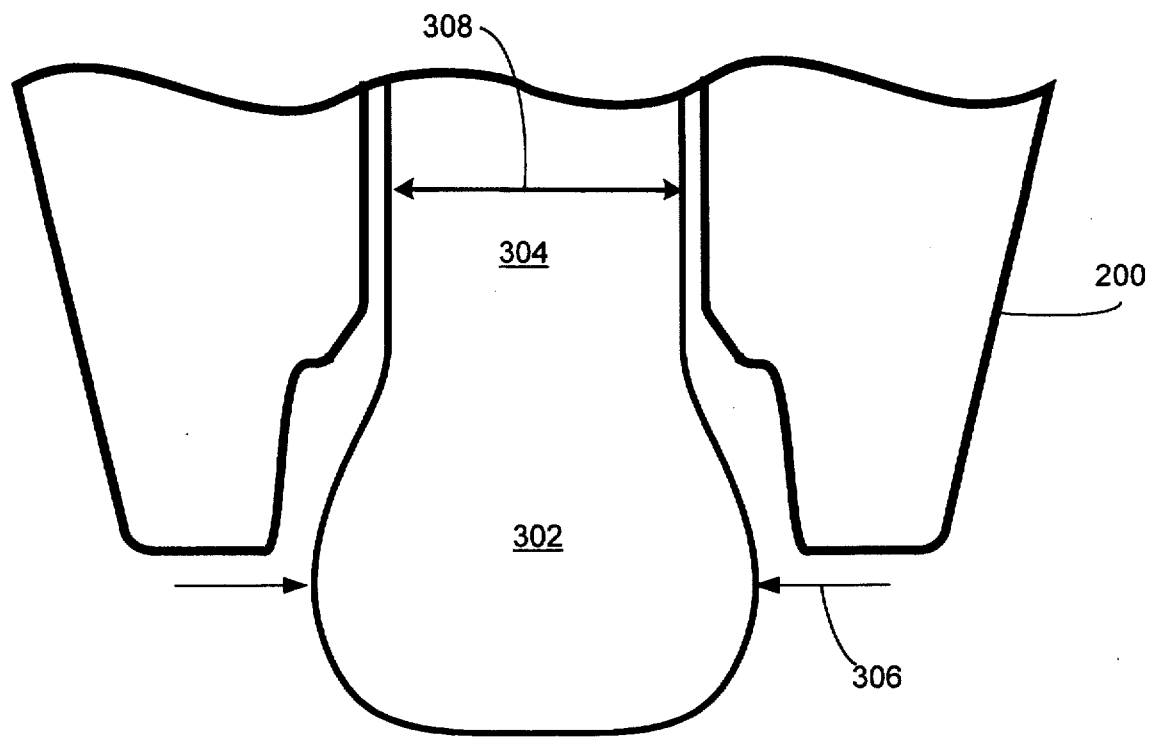
FIG. 3 is a diagrammatic vertical cross section of the capillary illustrated in FIG. 2 illustrating the formation of a free air ball at the distal end of a bonding wire.

FIG. 3 shows a vertical cross section of a free air ball 302 at a distal end of a bonding wire 304 which is horizontally constrained by the capillary 200. A bonding wire 304 may be formed from any suitable material, although as is well known to those skilled in the art, gold is most typical. Alternatively, aluminum and other materials may be used as well. The free air ball 302 has a free air ball diameter 306 which may vary for a given volume based on the surface tension properties of the liquefied bonding material. As mentioned above, an EFO mechanism is used in conjunction with wire bonder hardware and software to create the free air ball 302 of a desired size. In an embodiment of the present invention, the EFO mechanism and other parameters are controlled so that the free air ball 302 has a volume slightly larger than the volume of the cavity 214 of the capillary 200. With this arrangement, the free air ball 302 extends below the cavity 214 and when positioned over a bonding surface, will contact the bonding surface and can be ultrasonically welded thereto without contact between the capillary tip 202 and the bonding surface 401. When the free air ball 302 size and the standoff distance 407 are carefully calculated in relation to the cavity and chamfer volume, "flash" (i.e. material that extends beyond the cavity diameter 216) can be eliminated and the footprint of the ball bond can be precisely controlled.

Figure 4A:
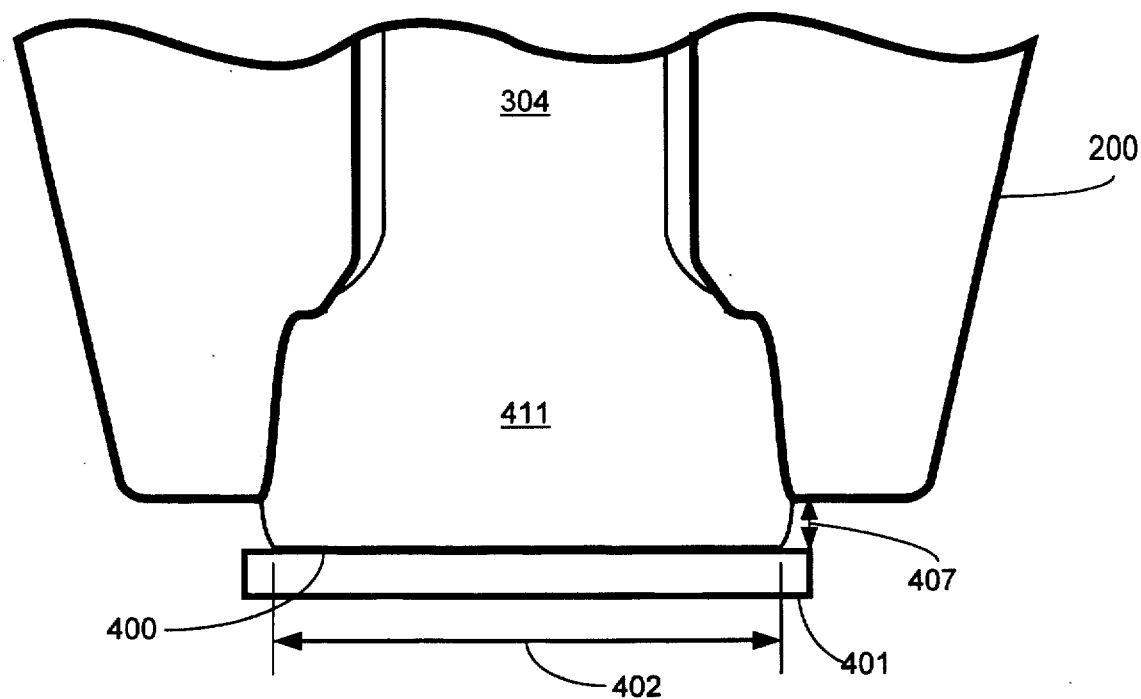
FIGS. 4a, 4b and 4c are diagrammatic vertical cross section of the capillary illustrated in FIG. 2 illustrating different ball bonds that may be created by the bonding apparatus.

FIG. 4a shows a vertical cross section of a ball bond 400 formed by a wire bonding apparatus using capillary 200. The ball bond 400 is formed between the distal end of the bonding wire 304 and the bond pad 401. A wire bonding apparatus (described below with reference to FIG. 5) is used in conjunction with the capillary 200, and ultrasonic energy to form the ball bond 400. Optionally, thermal energy from a heating stage may also be used to form the ball bond 400.

The cavity 214 of the capillary 200 molds the ball bond 400. The cavity walls 215 cooperate to mold the ball bond 400 into a shape that is substantially similar to the shape of the cavity 214. The shape and size (including the footprint 402) of the portion of the ball bond 400 below the capillary tip 202 are determined by the volume of the cavity 214, the volume of the free air ball 302 and the standoff distance 407. The standoff distance 407 is effectively the distance that the capillary tip 202 is positioned above a bonding surface 401 (in the embodiment shown, a bond pad on a die).

In the embodiment shown, it can be seen that the diameter of the footprint of the ball bond is actually less than the maximum diameter of the ball bond itself. This is believed to be due to the surface tension of the free air ball. While not wishing to be bound by theory, this ability to control the size of the footprint 402 is believed to be possible due to the molding effects of the cavity 214 and chamfer 210 combined with the surface tension of the liquefied bonding wire material that forms the free air ball. More specifically, it is believed that design of the cavity 214 and chamfer 210 are such that the resistance to flow into the chamfer 210 is less than the resistance to flow into flash due to the surface tension of the liquefied bonding material.

Figure 4B:
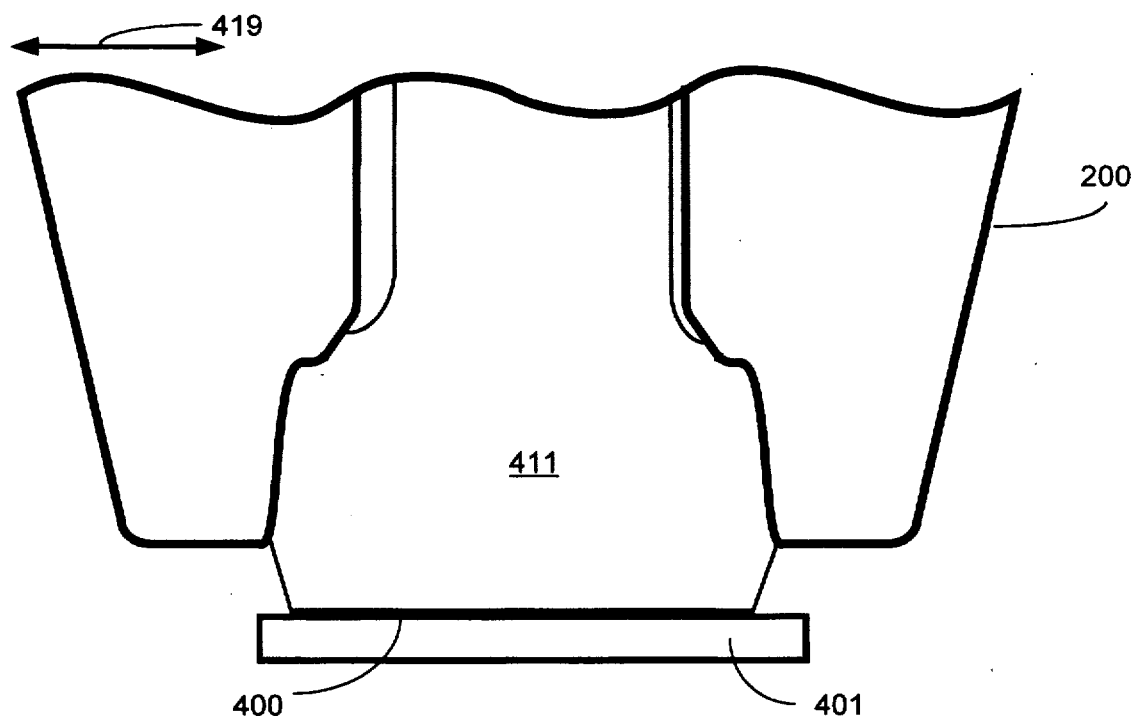

FIG. 4b shows one embodiment of the invention in which the footprint 402 is smaller than the cavity diameter 216. The portion of the ball bond below the surface of the capillary tip 202 has a substantially inverted frusto-conical or parabolic profile between the bonding surface 401 and the cavity 214. Ball bond structures having the geometry illustrated in FIG. 4b may readily be formed using the capillary 200 when the size of the free air ball and the position of the capillary tip 202 with respect to the bonding surface 401 are controlled.

One feature of the described capillary construction is that with the proper selection of the free air ball size, the ball bond footprint is somewhat independent of the bonding wire diameter 308. Specifically, the ball bond footprint is primarily a function of the footprint of the cavity 214. It should be appreciated that this can be a significant advantage in many applications since bigger wires may be used even in fine pitch devices. By way of example, 1.3 mil wires may be used in devices having pitches under approximately 125 microns, as for example in 70–80 micron in-line fine pitch devices. The use of larger diameter bonding wires permits longer wire spans than would otherwise be permissible when plastic packaging is used since the larger diameter bonding wires are less susceptible to wire sweep. By way of example, using a 1.3 mil bonding wire 304, wire spans of greater than 200 mils, as for example 220 mils and 250 mils have been shown to work well in plastic molded 70 micron pitch in-line devices. In contrast, in the applicant's experience, 70 micron pitch devices using 1 mil bonding wire 304 are generally limited to maximum spans on the order of 160 mils.

One method of forming ball bonds having footprints that are no larger than the footprint of a capillary opening in accordance with various specific embodiments of the present invention will now be described. A free air ball is formed using conventional techniques. However, the desired free air ball size is calculated somewhat differently. Specifically, in one embodiment, the desired ball size is calculated based primarily on the volume of cavity 214, the intended standoff distance between the capillary tip and the bonding surface and the volume of the portion of the chamfer that is nominally desired to be filled.

After the free air ball is formed, the capillary is moved into position over the bonding surface. Either force control or standoff height control may be used to position the capillary at the desired standoff distance relative to the bonding surface. As will be appreciated by those skilled in the art, typical standoff distances for conventional ball bonding apparatus and methods are in the range of 10 to 15 microns. With the described arrangement, it is possible to position the capillary tip 202 at a standoff distance 407 that is substantially closer than conventional methods. By way of example, standoff distances on the order of approximately 2 to 15 microns are appropriate for many applications. Indeed, standoff distances of less than 10 microns, as for example distances in the range of approximately 4–5 microns have been tested with success.

The standoff distance utilized will have some effect on the footprint of the ball bond with the footprint of the ball bond generally being slightly smaller with higher standoff distances. By way of example, footprints of 35 to 37 microns have been produced for a 38 micron cavity diameter 216 and a 25 micron bonding wire. On the other hand, it is believed that smaller standoff distances generally allow for more efficient transmission of the ultrasonic energy to form the ball bond 400 and thus superior bonding.

Using the force control approach, the amount of force selected is chosen such that the free air ball will be deformed within the internal chambers of the capillary sufficiently to conform to the inner chambers contours, yet not so much as to cause the creation of flash. That is, control of the bonding force is such that lowering of the capillary tip towards the bonding surface is ceased when the bonding machine senses an upward force that is slightly less than the force that prevents the bonding material 411 from flowing into the flash. The actual bonding force values appropriate for a particular situation will vary somewhat based on a variety of factors, including the capillary chamber designs, the surface tension of the free air ball and the capillary standoff distance. In an embodiment that uses the cavity based capillary described above, forces in the range of 50 to 100 mN, as for example 60 mN have worked well to provide the ball bond structure of FIG. 4b having a standoff distance of 4 to 5 microns. In this embodiment, the bonding force is sufficient to shape the ball bond in the form of the cavity, but not enough to cause excess bonding material to squish outward to form flash.

When conventional bonding forces are applied to conventional capillary designs, the pressure transferred to the liquefied bonding material is typically greater than the surface tension of the liquefied bonding material. In the applicant's experience, bonding forces of less than 250 mN have not been used with success. In contrast, in this described method aspect of the invention, lower bonding forces are used which reduces the probability of flow into flash. The cavity based capillary design illustrated above in FIG. 2 appears to enhance the benefits of the described method. Specifically, the cavity 214 and chamfer 210 are sized and shaped such that excess liquefied bonding material 411 from the cavity 214 flows into the chamfer 210 before it flow outward to form flash. That is, the cavity 214 and chamfer 210 are designed such that the resistance to fluid flow into the chamfer 210 is less than the resistance provided by the surface tension of the liquefied bonding material 411 and other forces.

Once the capillary is properly positioned over the bonding surface, ultrasonic welding is initiated. Conventional wire bonding machines typically permit the control of a number of parameters during ball bonding. These include, the intensity of ultrasonic energy applied to the bond (i.e. the bond power), the duration of the bonding (i.e. bonding time), the force applied during bonding (i.e. bond force) and the temperature utilized during bonding. Of course, the settings used for the various bonding parameters may be widely varied in accordance with the present invention. However, generally, it is possible to bond at significantly lower temperatures and use significantly lower bonding powers to form good quality bonds than would be possible using conventional approaches.

As will be appreciated by those skilled in the art, there are a number of applications where it is desirable to lower the temperature during bonding. One example is grid array type packages (e.g. BGAs, PGAs, etc.), where a temperature sensitive substrate material such as BT, FR4 or high temperature epoxy is used. However, the industry today is struggling to make reliable bonds at temperatures on the order of 150° C. One advantage of the described arrangement is that good quality bonding has been obtained even at room temperature. Thus, bonding can readily be done at temperatures below 100° C., 70° C., 50° C., at room temperature or whatever design rule is required for a particular application.

With respect to bond power, conventional ball bonding typically utilizes ultrasonic power in the 40 to 60 mW range. In contrast, for the capillary of FIG. 4a, bonding powers from 20 to 24 mW have worked well as well as bonding powers less than 20 mW. By way of example, a number of experiments have been successfully performed using a model ESEC 3006F/X wire bonding machine available from Suizer of Cham, Switzerland. Using such a machine and a capillary having a 1 mil bonding wire 304, a cavity diameter of about 1.4 mils and a standoff distance from 2–4 microns, bonding times on the order of 10 milliseconds @ 20–24 mW power worked well with a 100 mN force. In contrast, typical settings for the same machine when used for conventional ball bonding might utilize a bonding time on the order of 25 milliseconds @ 54 mW power with a bonding force of 400 mN. One advantage of using lower bonding powers is that it may result in longer tool life.

It should be appreciated that more bonding power can readily be used with the proposed encapsulated ball bonding method and apparatus during the ultrasonic welding process. Indeed, more power will often result in stronger ball bonds. A potential drawback to using more power is increased ball bonding time which may detrimentally increase production time. Additional bonding power also increases the risk of some of the bonding material spreading into flash. As pointed out above, in some embodiments, the surfaces of the cavity walls 215 and/or the chamfer 210 are matted (i.e. roughened). Tests have shown that the use of a matte surface for the cavity walls 215 improves the shear strength of the resulting ball bonds.

The described ball bonding methods have been discussed primarily in the context of using them in conjunction with the previously described cavity/chamfer capillary design. Although that arrangement has been found to work very well, it should be apparent that many of the advantages can be obtained by applying the described methods in systems which use capillaries having different chamber geometries. By way of example, it is believed that improved bonds may be obtained with double chamfer styled and/or double domed capillary designs as well.

Figure 4C:
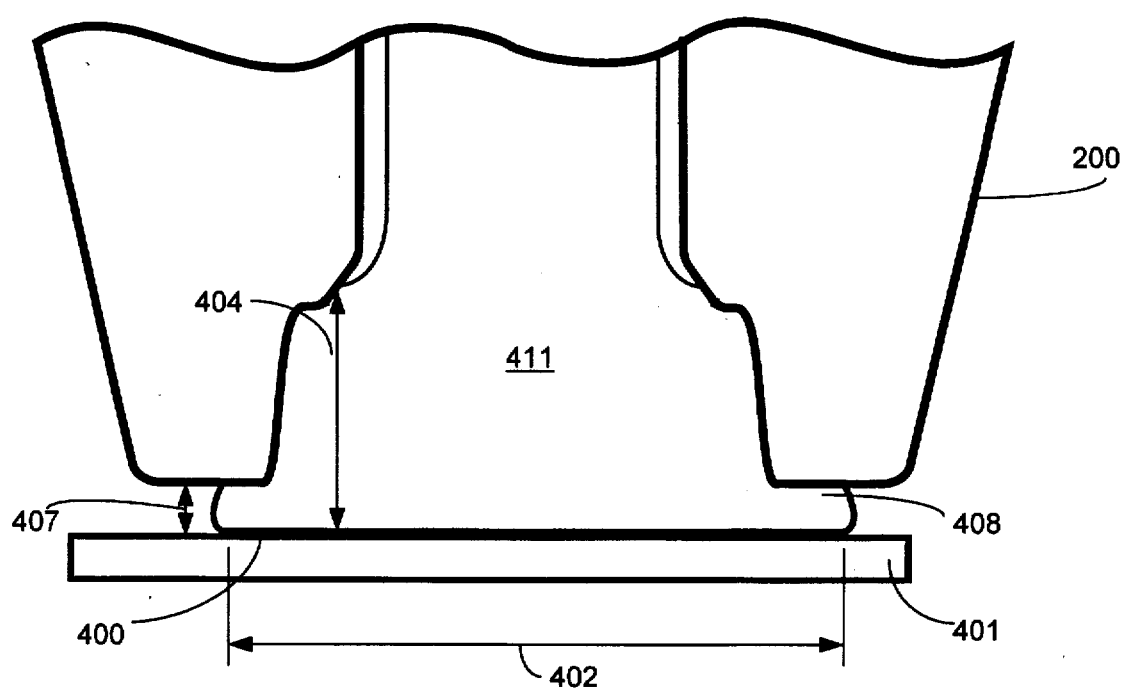

Referring next to FIG. 4C, an alternative method embodiment is illustrated. In this embodiment, a certain amount of flash 408 is formed under the capillary outside of the capillary. It should be appreciated that the described tools can be used to form good quality bonds that include flash. This type of ball bond structure may be formed when the volume of the free air ball 302 is larger than the volume required to fill the cavity 214 and chamfer 210 of FIG. 4a for a given standoff distance. It may also be formed when a bonding force is used that is substantially greater than the liquefied bonding material resistance to flow into the flash. By controlling the volume of the free air ball relative to the cavity volume, the amount of "flash" can be substantially controlled. When the free air ball 302 is slightly larger than the cavity volume and the appropriate standoff distance volume, there may be some flash of wire metal out from the perimeter of the cavity 214, meaning the footprint 402 is greater than the cavity diameter 216. Although FIG. 4C illustrates formation of flash on both sides of the cavity 214, it is understood that flash may form outside of the cavity for any portion or portions of ball bond 401. Although such arrangements work well, they are slightly less consistent in size than the optimally formed balls of FIG. 4B.

Figure 5:
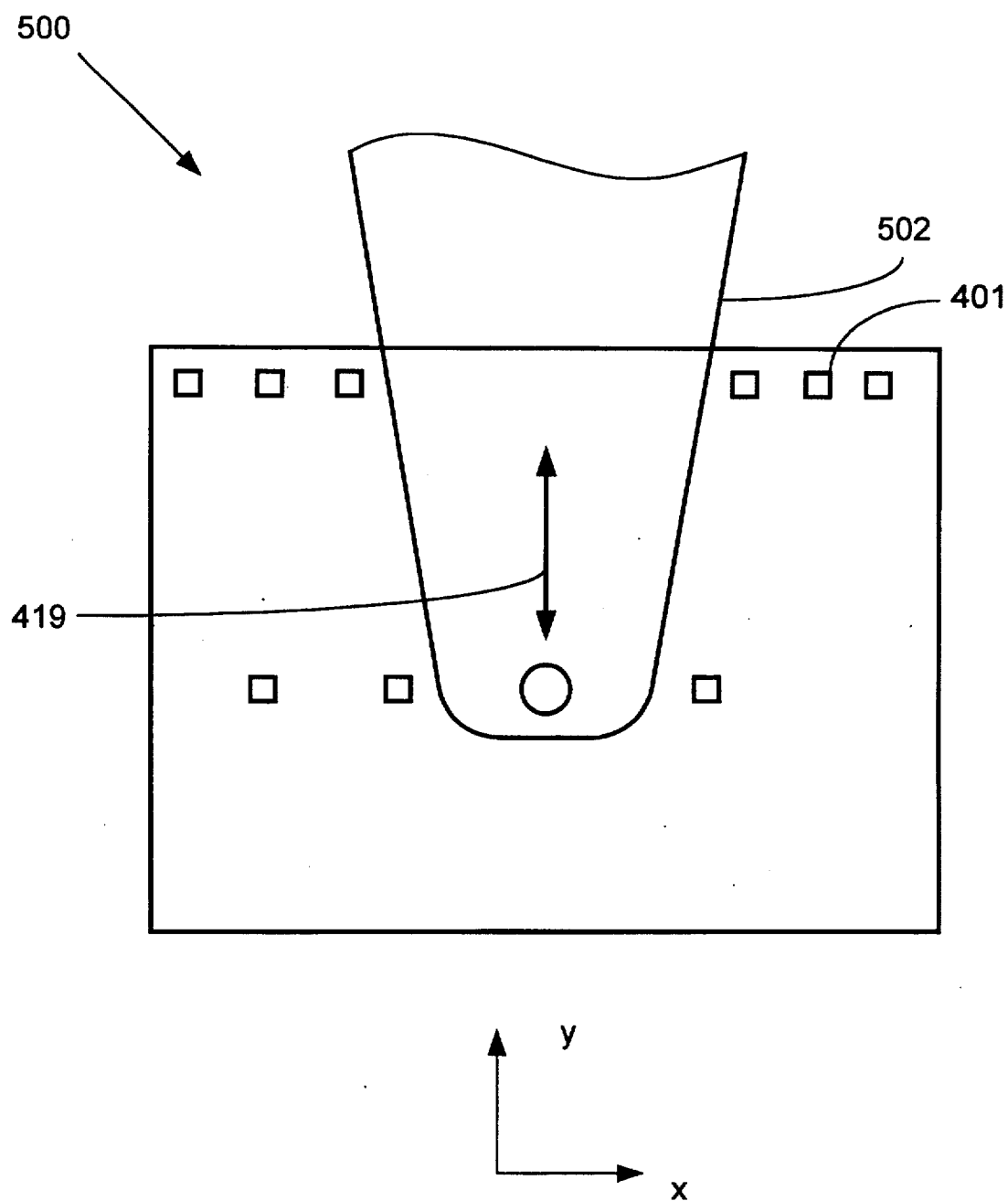
FIG. 5 is a diagrammatic top view of a bonding apparatus.

Referring next to FIG. 5, some of the other advantages of the described capillary and bonding methods will be described. FIG. 5 is a simplified top view of a typical ball bonding apparatus 500. Conventional ball bonding machines provide directionally specific ultrasonic energy as determined by an ultrasonic transducer 502. The ultrasonic transducer 502 conventionally provides a directionally specific ultrasonic agitation 419. By way of example, in this case the directionally specific agitation translates laterally in the y direction, as shown in FIGS. 5 and 4B. A representative conventional ultrasonic transducers may provide 75% of the ultrasonic energy laterally in a direction parallel to the bonding surface 401 and the remaining 25% of the ultrasonic energy in a vertical direction perpendicular to the bonding surface 401. As will be appreciated by those skilled in the art, the shear strength of conventional ball bonds is directionally dependent on the lateral direction of ultrasonic energy supplied. For example, on a standard ball bonding apparatus, ball shear strength in the direction of transducer motion may be 30 grams while ball shear strength in the lateral direction perpendicular to the directionally specific ultrasonic agitation 419 may be 25 grams.

To accommodate for reduced shear strengths in the non-lateral directions, it is common for standard ball bonding machines to have a compensation factor. The compensation factor is a means by which the bonding machine translates linear directional motion of the ultrasonic transducer 502 into the perpendicular lateral direction. In this manner, shear strength uniformity may be achieved in all directions. Conventionally, a compensation factor on the order of 30% may be used to accommodate for low shear strengths in the direction perpendicular to transducer agitation.

Another advantage of the described bonding arrangement is that it produces bonds that are significantly more uniform in their shear strength. Thus, good bonds are readily obtained with a 0% compensation factor regardless of the bonding orientation. By way of example, typical conventional parameters using the described ESEC 3006 F/X bonder to form ball bonds on a 70 micron pitch die using a 1 mil wire and forming a 36 micron free air ball might be on the order of 50 mW bond power, using 300 mN bond force for a duration of approximately 15 milli-seconds and a compensation factor of 30% for bonds that are perpendicular to the transducer agitation. With the described arrangement, parameters for a 70 micron pitch die using a 1 mil wire and forming a 36 micron free air ball might be in the range of 20–32 mW bond power, using 100–50 mN bond force for a duration of approximately 15 milli-seconds and a compensation factor of 0%.

Figure 6A:
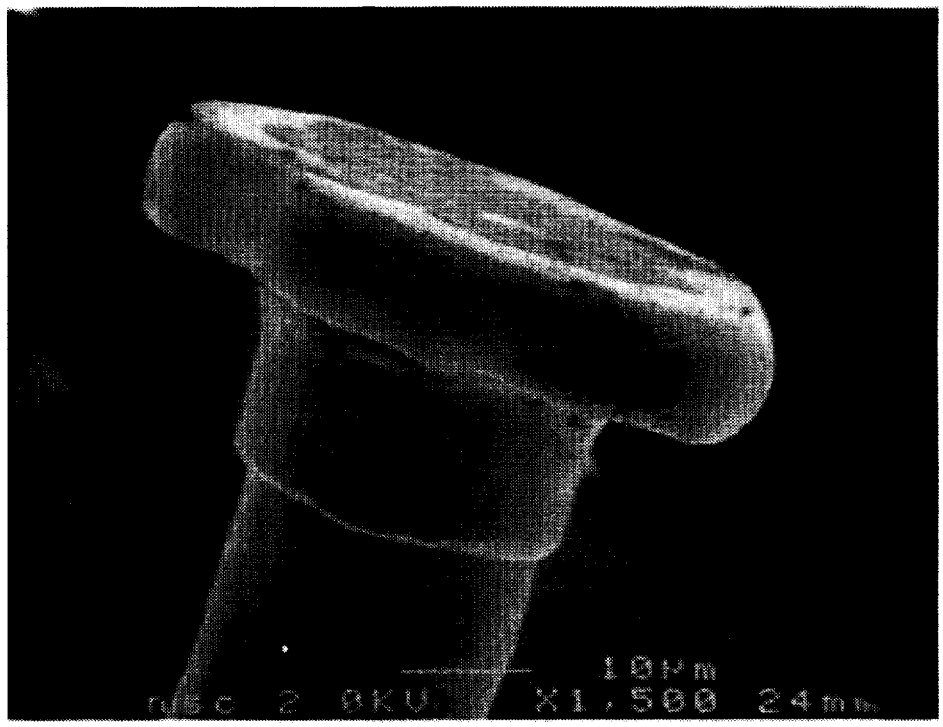
FIG. 6A is a photograph showing a ball bond formed conventionally in a 70 micron pitch device.
Figure 6B:
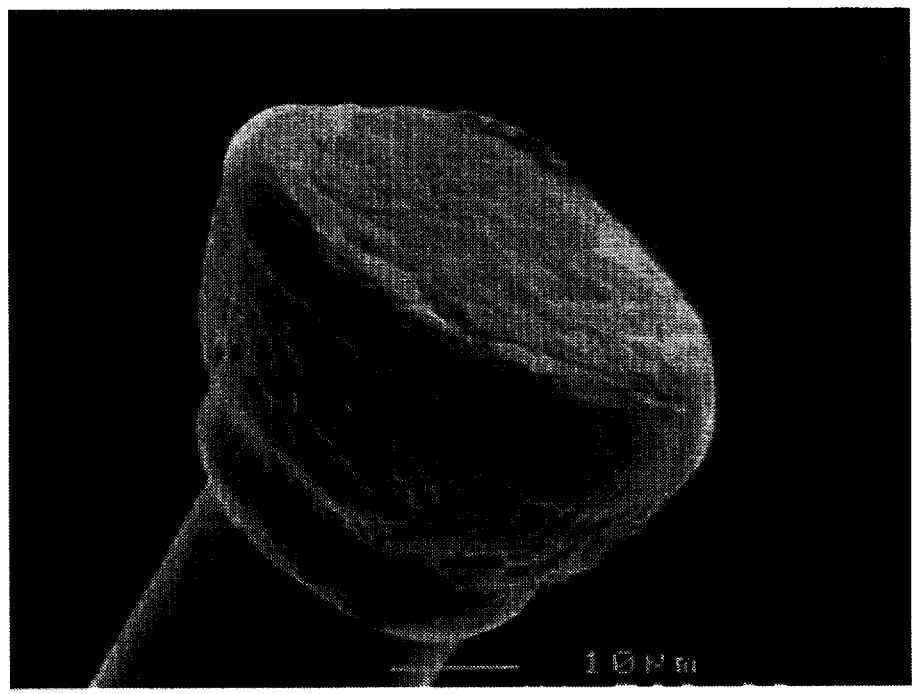
FIG. 6B is a photograph showing a ball bond formed in accordance with an embodiment of the present invention.

A further advantage of the described arrangement is improved intermetallic growth between the bonding surface and the bonding material. FIG. 6 shows intermetallic formations between a ball bonding material of gold and a bonding surface of aluminum. FIG. 6A shows the intermetallic formation between the gold bonding material and aluminum bonding surface for a conventional ball bond. In this case, the intermetallic growth is inconsistent and contains substantial area, particularly in the flash, where the two materials have not bonded. In FIG. 6B, the ball bond formed using capillary 200 and the proposed ball bonding method is shown. In this case, the intermetallic growth encompasses a substantially larger proportion of the ball bonding area, and has a more consistent profile with less regions of improper intermetallic growth. It should be noted that formation of the intermetallic gold bond material is normally less than 100% complete for the bonding structure.

In addition, the thickness of the intermetallic growth is substantially thicker than generally obtained using conventional ball bonding techniques. This increase in thickness provides a stronger ball bond. By way of example, the typical shear strength of a ball bond using a gold 1 mil diameter bonding wire 304 on an aluminum bond pad in a 70 micron pitch device may be on the order of 5.5 to 6 g/mil$^2$. In contrast, experiments have shown that shear strength on the order of 7.5 to 9 g/mil$^2$ is readily obtained using the described arrangement for ultrasonic frequencies ranging from 100 to 240 kHz. Tests have shown that a substantial amount of the gold bonding material penetrates the aluminum bond pad surface and remains even after the ball bond is sheared off.

Figure 8:
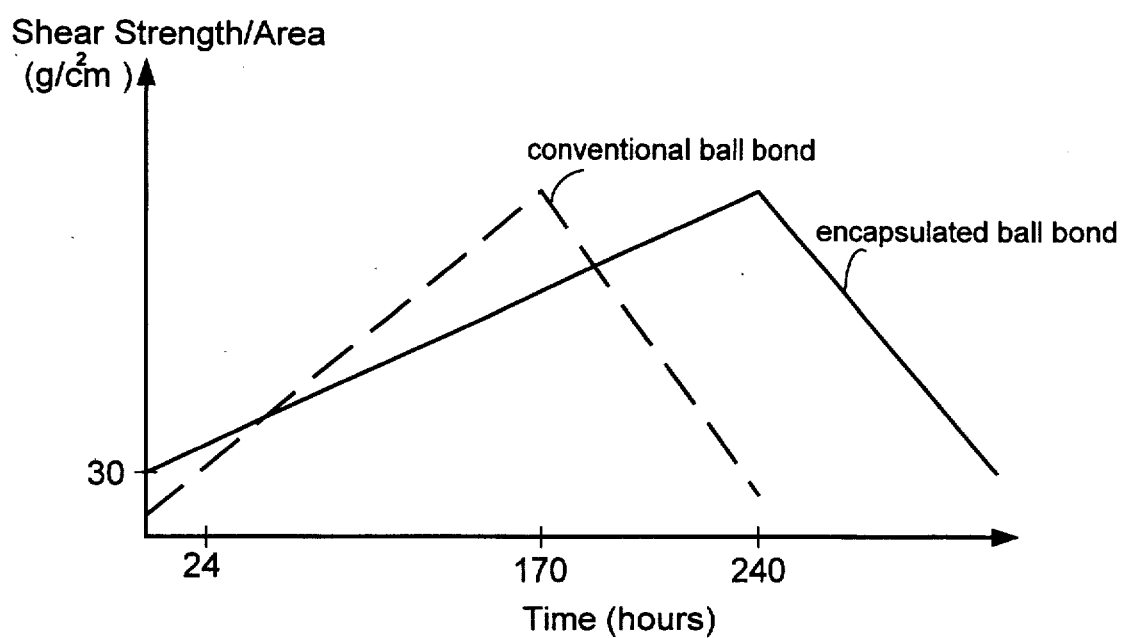
FIG. 8 illustrates the shear strength per unit area of a ball bond operating at an elevated temperature of in the range of 175 to 250 degrees Celsius for an extended period of time.

Another advantage of capillary 200 is a better service life of the ball bond. FIG. 8 illustrates the shear strength per unit area of a ball bond operating at an elevated temperature of in the range of 175 to 250 degrees Celsius for an extended period of time. This may represent the development of a ball bond over time under normal conditions. Specifically, over time, the intermetallic region grows and passes through different intermetallic phases. Thus, the relative strength and brittleness of the bond changes over time. As seen in FIG. 8, at the time of bonding the bond may have a shear strength below 30 grams and the shear strength peaks at approximately 170 hours. Thereafter, degradation of the bond strength will follow which may lead to brittle failure. At this point, the bond may be ineffective. It is important to note that in conventional ball bonding fabrication, it is common for the silicon die to be placed in an oven for an extended period of time to facilitate intermetallic growth between the aluminum and the gold using thermal energy. For the case of FIG. 8, it is common for the bonding material to be placed in an oven of 175 degrees for two hours to allow intermetallic growth. The remainder of the curve of FIG. 8 may represent the life cycle of the bond at an operating temperature of 175 degrees Celsius.

For the case of the described ball bond, there are two substantial improvements in the shear strength versus time representation of the ball bond. FIG. 8 shows the shear strength versus time life cycle for a ball bond formed using the capillary 200. It is important to note that the ball bond starts at a shear strength that is significantly higher than the conventional ball bonding method. This may advantageously remove the need for post-ball bonding heating to facilitate intermetallic formation. Further, the rate of growth of the shear strength is less gradual over time. This translates into reaching the peak shear strength and ensuing brittle degradation at a longer service life of the ball bond.

Figure 9:
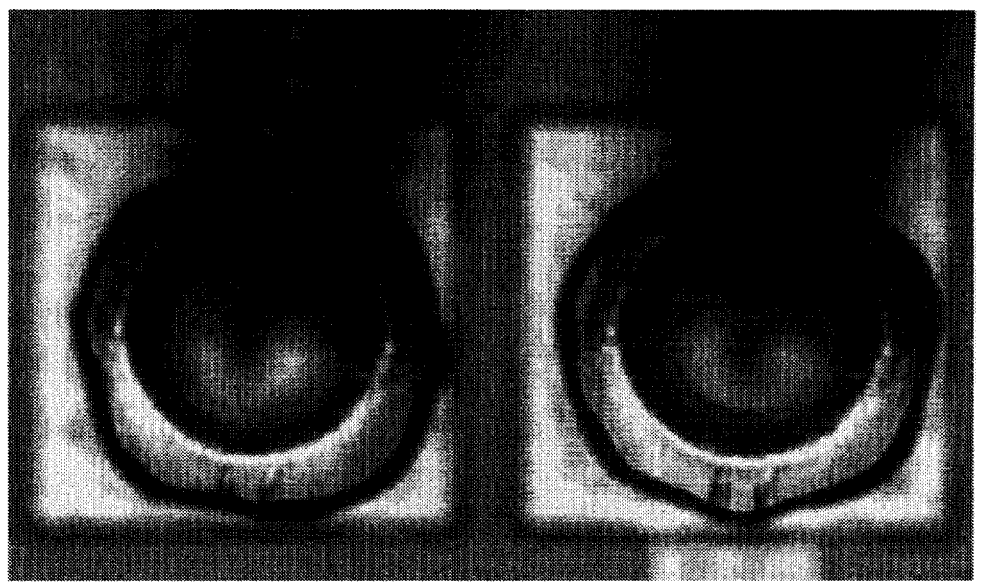
FIG. 9 is a photograph showing a top down view of an array of conventionally formed ball bonds in a 70 micron pitch device.
Figure 10:
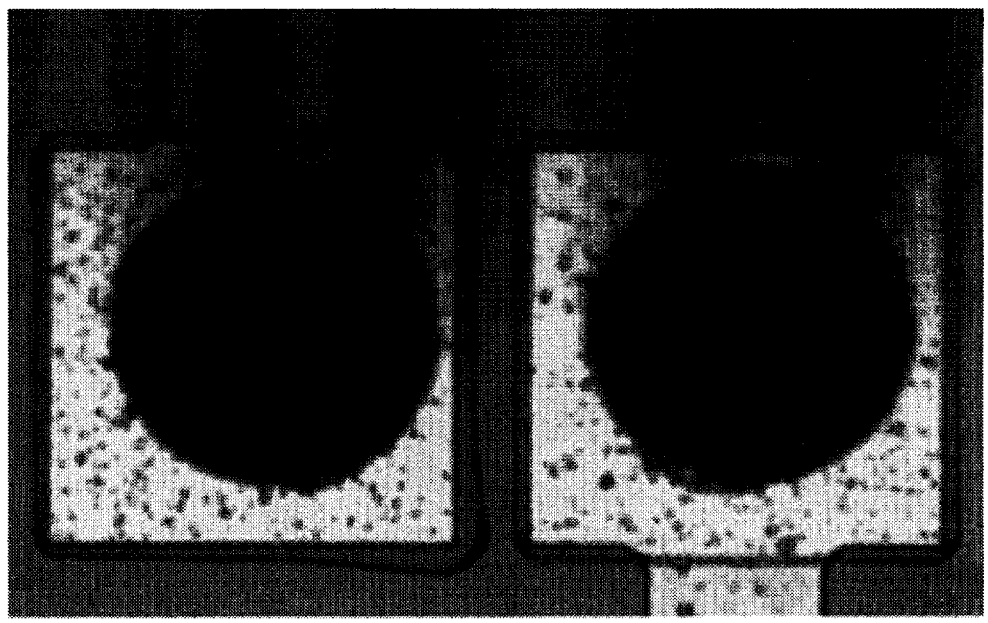
FIG. 10 is a photograph showing a top down view of an array of ball bonds formed in accordance with an embodiment of the present invention in a 70 micron pitch device.

As described above, with the proper selection of the various bonding parameters including the free air ball size, the footprint size of the resulting ball bonds is very consistent. By way of example in various experiments, the standard deviation of the footprint tolerance has been reduced to less than 1 micron. In the applicant's experience, this is significantly better than is obtainable using standard techniques. This improvement is illustrated in FIGS. 9 and 10. FIG. 9 is a photograph of an array of conventionally formed ball bonds in a 70 micron pitch device. As seen therein, there are relatively significant variation in the footprint shape of the ball bond. In the photograph shown, the average diameter is about 51 microns with variations of up to 7 microns overall and a standard deviation on the order of 2 microns. In contrast FIG. 10 is a photograph of an array of ball bonds in a 70 micron pitch device using an embodiment of the present invention. One point to notice is that the ball bonds are significantly smaller in diameter with a 46 micron average diameter, and that the variation between bonds are also smaller. In the photograph shown, the variations are at most 3 microns and the standard deviation is 0.4 microns. In some situations, the ability to maintain a better tolerance on the footprint 407 makes it possible to relax the positional accuracy of the bonding machine. This may allow the use of an older generation bonding machine and/or may allow for improved production times.

Figure 7:
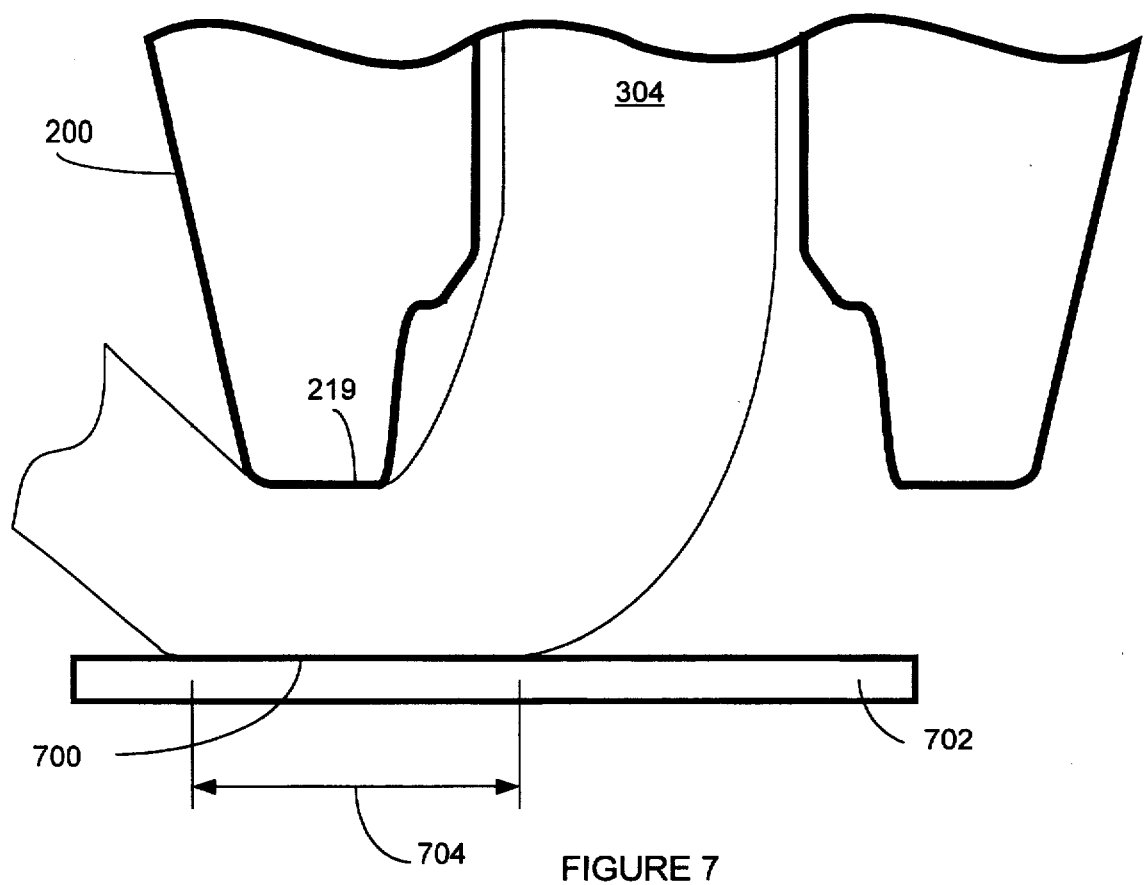
FIG. 7 is a diagrammatic vertical cross section of the capillary illustrated in FIG. 2 illustrating a wedge bond created by the bonding apparatus.

FIG. 7 shows a vertical cross section of a wedge bond 700 formed by a wire bonding apparatus using capillary 200. During wedge bonding, the wedge surface 219 of the capillary 200 applies a force to a section of the bonding wire 304. The wedge bond 700 can be formed between the section of the bonding wire 304 and a surface of a lead 702 of a semiconductor device. A wire bonding apparatus using the capillary 200 requires a relatively small area of contact to make a wedge bond 700. The wedge bond 700 has a wedge bond length 704. Because a wire bonding apparatus using the capillary 200 of the present invention requires a small area of contact to make a wedge bond 700, the capillary 200 is particularly useful for forming wedge bonds 700 on very fine inner lead pitch frames.

Although only a few embodiments of the present invention have been described in detail, it should be understood that the present invention may be embodied in many other specific forms without departing from the spirit or scope of the invention. Particularly, although the invention has been described primarily in the context of wire bonding for small pitch devices, the advantages including improved ball bond integrity are equally applicable to larger pitch devices as well. As pointed out, the diameter of the cavity 214 need not be greatly larger than the bonding wire bore diameter and indeed one of the advantages of the present invention is that the bond quality appears to quite good with relatively large variations in the respective ratios of the cavity diameter, bore diameter and capillary tip diameter. Also, it is believed that the described method aspects of the invention will provide improved bonding results using a wide variety of capillary tip geometries including double chamfer and double domed geometries.

Additionally, the relative bond powers timing and force used may be widely varied in accordance with the needs of a particular system. Therefore, the present examples are to be considered as illustrative and not restrictive, and the invention is not to be limited to the details given herein, but may be modified within the scope of the appended claims.

What is claimed is:

1. A method of wire bonding using a capillary driven by a wire bonding machine, said method comprising:

forming a free air ball of substantially a predetermined size at a distal end of a bonding wire, wherein the free air ball is at least partially contained within a cavity within a distal tip of the capillary;

positioning the capillary tip at a substantially predetermined proximity to a bonding surface such that the free air ball contacts the bonding surface; and ultrasonically welding the distal end of the bonding wire to the bonding surface to form a ball bond such that the footprint diameter of the ball bond is less than the diameter of the cavity.

2. A method as recited in claim 1 wherein the standard deviation of a footprint tolerance produced by the capillary is less than approximately 1 micron.

3. A method as recited in claim 1 wherein the surface of the bonding surface is not pre-heated.

4. A method as recited in claim 1 wherein the capillary is positioned at a distance of less than approximately 10 microns from the bonding surface during the ultrasonic welding.

5. A method as recited in claim 1 wherein the capillary is positioned at a distance of not more than approximately 5 microns from the bonding surface during the ultrasonic welding.

6. A method as recited in claim 1 wherein the bonding surface is a bond pad on a die having a pad pitch of less than approximately 70 microns.

7. A method as recited in claim 1 wherein the ultrasonic welding is done using a bonding power of less than approximately 40 milliwatts.

8. A method as recited in claim 1 wherein the ultrasonic welding is done using a force of less than approximately 250 mN.

9. A method of wire bonding using a capillary driven by a wire bonding machine, the method comprising:

forming a free air ball at a distal end of a bonding wire that passes through the capillary;

positioning the capillary tip in proximity to a bonding surface such that the free air ball is pressed into contact with the bonding surface, wherein the force applied to the free air ball does not squish the free air ball prior sufficiently to create significant flash; and ultrasonically welding a ball bond to the bonding surface using a bonding force of less than approximately 250 mN.

10. A method as recited in claim 9 wherein the ultrasonic welding when the bonding surface has a temperature of less than approximately 150 degrees centigrade.

11. A method as recited in claim 9 wherein the ultrasonic welding is performed while the bonding surface has a temperature of less than approximately 100 degrees centigrade.

12. A method as recited in claim 9 wherein the ultrasonic welding is performed at substantially room temperature.

13. A method as recited in claim 9 wherein the ultrasonic welding is performed using a bond force of less than approximately 100 mN.

14. A method as recited in claim 9 wherein the capillary is positioned at a distance of not more than approximately 5 microns from the bonding surface during the ultrasonic welding.

15. A method of wire bonding using a capillary driven by a wire bonding machine, said method comprising:

forming a free air ball at a distal end of a bonding wire, wherein the free air ball is at least partially contained within a cavity in a distal tip of the capillary;

positioning the capillary tip in proximity to a bonding surface such that the free air ball contacts the bonding surface; and ultrasonically welding a ball bond that is substantially similar to the shape to the cavity wherein the ball bond has a shear strength of at least 7.5 $g/mil^2$.

16. The method of claim 15 wherein the ball bond has a shear strength between approximately 7.5 and 9.0 $g/mil^2$.

17. The method of claim 15 wherein the surface of the bonding surface is heated to less than 140 degrees centigrade during the ultrasonic welding step.

18. The method of claim 15 wherein the ultrasonic welding is done using a bonding power of no more than approximately 40 mW.

19. A method of wire bonding using a capillary driven by a wire bonding machine, the method comprising:

forming a free air ball at a distal end of a bonding wire that passes through the capillary;

positioning the capillary tip in proximity to a bonding surface such that the free air ball is pressed into contact with the bonding surface; and ultrasonically welding a ball bond to the bonding surface, wherein the temperature of the surface to be bonded is less than approximately 100 degrees centigrade.

20. The method of claim 19 wherein the surface to be bonded is not pre-heated.

21. A method as recited in claim 19 wherein the ultrasonic welding is performed while the bonding surface has a temperature of less than approximately 40 degrees centigrade.

* * * * *